United States Patent
Song et al.

(10) Patent No.: US 8,586,964 B2
(45) Date of Patent: Nov. 19, 2013

(54) P-TYPE SEMICONDUCTOR DEVICE COMPRISING TYPE-2 QUANTUM WELL AND FABRICATION METHOD THEREOF

(75) Inventors: Jin-Dong Song, Seoul (KR); Sang Hoon Shin, Busan (KR); Hyung-jun Kim, Seoul (KR); Hyun Cheol Koo, Seoul (KR); Suk Hee Han, Seoul (KR); Joonyeon Chang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 415 days.

(21) Appl. No.: 12/911,560

(22) Filed: Oct. 25, 2010

(65) Prior Publication Data

US 2012/0007045 A1     Jan. 12, 2012

(30) Foreign Application Priority Data

Jul. 8, 2010   (KR) .................. 10-2010-0065694

(51) Int. Cl.
   *H01L 29/15*  (2006.01)
(52) U.S. Cl.
   USPC ........ 257/14; 257/22; 257/E29.072; 977/755; 977/759; 438/47; 438/98
(58) Field of Classification Search
   USPC ............... 257/14, 22, E29.072; 977/755, 759
   See application file for complete search history.

(56) References Cited

U.S. PATENT DOCUMENTS

| 7,256,417 | B2 * | 8/2007 | Mawst et al. | .................. 257/14 |
| 2009/0135875 | A1 * | 5/2009 | Ueda et al. | ............... 372/45.012 |

OTHER PUBLICATIONS

G. Hock et al., "Carrier Mobilities in Modulation Doped Si1-xGex Heterostructures With Respect To FET Applications", Thin Solid Films, vol. 336, pp. 141-144, Dec. 30, 1998.
J.B. Boos et al., "Sb-based n- and p-channel Heterostructure FETs For High-Speed, Low Power Applications", IEICE Transactions on Electronics, vol. E91c, pp. 1050-1057, Jul. 2008.
R.F. Service, "Is Silicon's Reign Nearing Its End?", Science, vol. 323, pp. 1000-1002, Feb. 20, 2009.

* cited by examiner

*Primary Examiner* — Daniel Whalen
*Assistant Examiner* — Suberr Chi
(74) *Attorney, Agent, or Firm* — Tutunjian & Bitetto, P.C.

(57) ABSTRACT

Disclosed herein are a method of generating a two-dimensional hole gas (2DHG) using a type-2 quantum well formed using semiconductors with different electron affinities or band gap, and a high-speed p-type semiconductor device using the 2DHG. To this end, the method includes providing a semiconductor substrate; growing a first semiconductor layer on the semiconductor substrate, growing a second semiconductor layer with a different electron affinity or band gap from the first semiconductor layer on the first semiconductor layer, and growing a third semiconductor layer with a different electron affinity or band gap from the second semiconductor layer, thereby forming a type-2 quantum well; and forming a p-type doping layer in the vicinity of the type-2 quantum well, thereby generating the 2DHG.

19 Claims, 4 Drawing Sheets

|  | Speed of Charges in Different Materials (cm$^2$/Vs) | | | | | | |
|---|---|---|---|---|---|---|---|
| Material | Si | GaAs | In$_{0.53}$Ga$_{0.47}$As | InAs | InSb | Ge | GaSb |
| Electrons | 300 | 7,000 | 10,000 | 15,000 | 30,000 | 3,900 | 5,000 |
| Holes | 450 | 400 | 200 | 460 | 1,250 | 1,900 | 1,500 |

P-TYPE SEMICONDUCTOR DEVICE COMPRISING TYPE-2 QUANTUM WELL AND FABRICATION METHOD THEREOF

CROSS-REFERENCE TO RELATED APPLICATION

This application claims priority from and the benefit of Korean Patent Application No. 10-2010-0065694, filed on Jul. 8, 2010, which is hereby incorporated by reference for all purposes as if fully set forth herein.

BACKGROUND

1. Field of the Invention

Disclosed herein are a semiconductor device and a fabrication method thereof.

2. Description of the Related Art

Efforts for developing technologies for Si-based semiconductors have been focused on reducing the linewidth of devices for recent 10 years. Semiconductor companies such as Samsung, Hynix and Intel have made efforts to reduce the linewidth of devices from 30 nm to 20 nm and then to 15 nm. However, it is considered that if the line width of the device finally reaches 10 nm, it is impossible to develop technologies for reducing the Si linewidth. Currently, a group III-V complementary compound semiconductor device, a carbon nanotube, a nanoline technology are proposed as technologies to be substituted for the technologies for Si-based semiconductors posterior to Si semiconductors. [R. F. Service, "Is Silicon's Reign Nearing Its Ends?", Science, vol. 323, pp. 1000-1002, Feb. 20, 2009] Among these technologies, it is expected that the group III-V complementary compound semiconductor devices will be realized fastest. Although compound semiconductors have electron mobility 10 to 100 times greater than Si semiconductors, it is difficult to implement digital logic devices using the compound semiconductors. This is because there are various technical problems. Among these problems, it is the most serious problem to implement p-type group III-V semiconductors device using holes as carriers.

This is because a complementary structure in which an n-type semiconductor device using electrons as carriers and a p-type semiconductor device using holes as carriers are combined together is necessarily required in logic devices. That is, the complementary structure hardly requires electric power for memorizing the state of logic, but the structure using only electrons or holes as carriers requires electric power for maintaining a record. However, although representative group III-V semiconductors such as GaAs and InP have fast electron mobility, their hole mobility is hardly different from that of Si semiconductors (see FIG. 1). Further, in spite of the fast electron mobility, the operating speed of complementary semiconductor devices using the group III-V semiconductors are hardly faster than that of the Si semiconductors. Hence, it is unnecessary to fabricate semiconductor devices using a high-priced group III-V semiconductor substrate. Therefore, in practical applications, compound semiconductor devices that operate at a high speed of more than 500 GHz consume more powers than complementary Si semiconductor devices. Accordingly, the compound semiconductor devices are frequently used as analog devices such as high-speed amplifiers rather than logic devices. In a case where the compound semiconductor devices are used as the logic devices, they are partially applied to military logic devices.

However, since year 2000, group III-V semiconductor devices that operate 2 to 3 times faster than p-type Si semiconductor devices have been fabricated using a method for increasing hole mobility by modifying the band gap structure of light and heavy holes using a strain. In 2008, it was reported that p-type group III-V semiconductor devices fabricated through a 0.2 μm pattern process were operated at 34 GHz. With the continuous development of semiconductor devices, it is expected that group III-V based complementary logic devices will be developed in five years. [J. B. Boos et al., "Sb-based n- and p-channel heterostructure FETs for high-speed, low-power applications", IEICE Transactions on Electronics, vol. E91c, pp. 1050-1057, Jul. 2008]

FIG. 1 is a table showing electron and hole mobilities of various semiconductor materials, measured at normal temperature. In existing inventions and studies, two-dimensional hole gas (2DHG) with a type-1 quantum well structure is generated by applying the fast hole mobility of Ge [G Hook et al., "Carrier mobilities in modulation doped Si1-xGex heterostructures with respect to FET applications", Thin Solid Films, vol. 336, pp. 141-144, Dec. 30, 1998] or by using InSb or GeSb, and hole mobility is increased by adding a strain effect to the 2DHG. [J. B. Boos et al.]

SiGe semiconductor device is fabricated as a complementary semiconductor device by combining a small amount of Ge with existing Si, so that an existing Si process can be used in the fabrication of the SiGe semiconductor device. Because of the lattice mismatch between Si (0.54 nm) and Ge (0.57 nm), there exists another technical problem in injecting a large amount of Ge into Si. Therefore, the electron and hole mobilities of Si containing a small amount of Ge are higher than those of pure Si but lower than those of another group III-V semiconductor and pure Ge. Hence, the fabrication of SiGe semiconductor device is considered as an intermediate technology between Si technology and group III-V semiconductor technology.

Since InSb or GaSb has high hole mobility (see FIG. 1), it is suitable for 2DHG of p-type semiconductor devices, but the quantum wall of a semiconductor such as AlGaSb with a lattice coefficient of more than 0.6 nm is required to grow InSb or GaSb using the type-1 quantum well structure. In addition, the InSb or GaSb is not lattice-matched with GaAs (0.56 nm) or InP (0.58 nm) that can be easily obtained. Therefore, a new growth technology such as meta-morphic is required, and new processes such as etching and metal bonding are necessarily designed.

SUMMARY OF THE INVENTION

Disclosed herein is a method of generating a two-dimensional hole gas (2DHG) using a type-2 quantum well so as to implement a complementary logic circuit of a group III-V compound semiconductor.

Further disclosed herein is a high-speed p-type group III-V compound semiconductor device with a new structure using the 2DHG.

In one embodiment, there is provided a p-type semiconductor device including: a semiconductor substrate; and a type-2 quantum well formed of semiconductor materials with different electron affinities or band gaps on the semiconductor substrate. Unlike a type-1 quantum well in which a material with a narrow band gap is aligned between materials with a wide band gap, so that electrons and holes are all trapped in a quantum well (see FIG. 3), in the type-2 quantum well, the band alignment of two materials is biased to one side, so that only one of electrons and holes are trapped in a quantum well (FIG. 4).

The type-2 quantum well may include a first semiconductor layer grown on the semiconductor substrate, a semiconductor layer that is grown on the first semiconductor layer and has a different electron affinity or band gap from the first semiconductor layer, and a third semiconductor layer that is grown on the second semiconductor layer and has a different electron affinity or band gap from the second semiconductor. The first and third semiconductor layers may be made of the same material.

The semiconductor substrate may be made of InP. The first or third semiconductor layer may be made of InGaAs. The second semiconductor layer may be made of GaSb.

The p-type semiconductor device may further include a p-type doping layer formed in the vicinity of the type-2 quantum well, and the p-type doping layer may be made of InP doped with a p-type impurity.

The p-type semiconductor device may further include a buffer layer interposed between the semiconductor substrate and the type-2 quantum well, and the buffer layer may be made of InAlAs.

The p-type semiconductor device may further include a semi-insulating first space layer interposed between the type-2 quantum well and the p-type doping layer, and the semi-insulating first space layer may be made of InP.

The p-type semiconductor device may further include a semi-insulating second space layer formed on the p-type doping layer, and the semi-insulating second space layer may be made of InP.

The p-type semiconductor device may further include a Schottky junction layer formed on the semi-insulating second space layer, and the Schottky junction layer may be made of InAlAs.

The p-type semiconductor device may further include an ohmic contact layer formed on the Schottky junction layer, and the ohmic contact layer may be made of InGaAs doped with a p-type impurity.

In another embodiment, there is provided a fabrication method of a p-type semiconductor device, the method including: providing a semiconductor substrate; and growing a first semiconductor layer on the semiconductor substrate, growing a second semiconductor layer with a different electron affinity or band gap from the first semiconductor layer on the first semiconductor layer, and growing a third semiconductor layer with a different electron affinity or band gap from the second semiconductor layer, thereby forming a type-2 quantum well.

The method may further include foaming a p-type doping layer in the vicinity of the type-2 quantum well, thereby generating a two-dimensional hole gas.

The method may further include forming a buffer layer between the semiconductor substrate and the type-2 quantum well.

The method may further include forming a semi-insulating space layer between the type-2 quantum well and the p-type doping layer.

Although it has been described in a specific embodiment that the first and third semiconductor layers are made of the same material so as to form the type-2 quantum well, they may be made of different materials from each other within the definition of the type-2 quantum well.

BRIEF DESCRIPTION OF THE DRAWINGS

The above and other aspects, features and advantages disclosed herein will become apparent from the following description of preferred embodiments given in conjunction with the accompanying drawings, in which.

DETAILED DESCRIPTION OF THE INVENTION

Figures 1, 2:
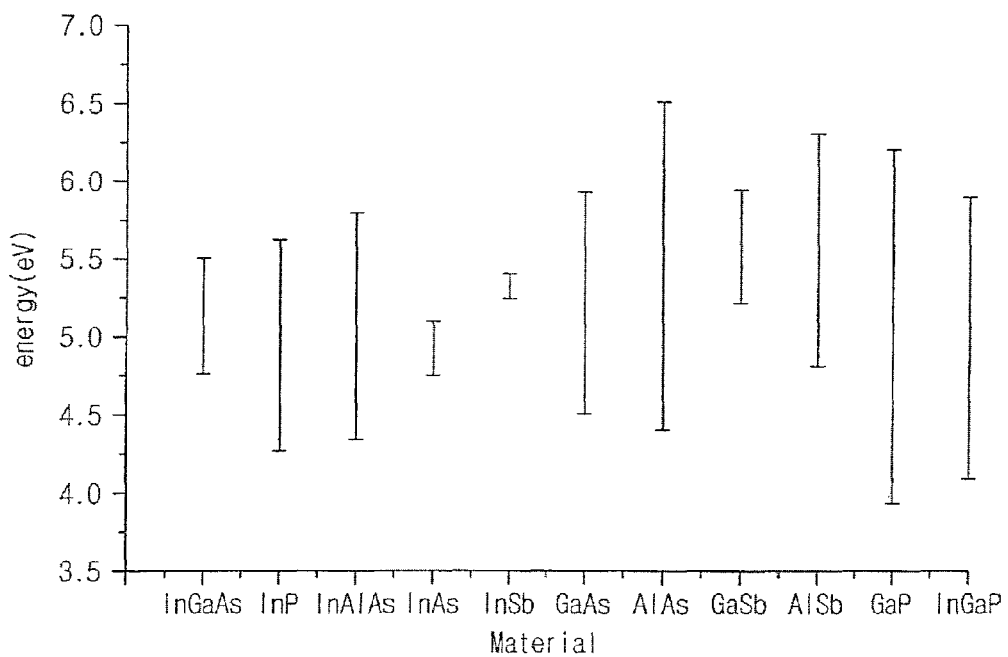
FIG. 1 is a table showing electron and hole mobilities of various semiconductor materials, measured at normal temperature; [R. F. Service, "Is Silicon's Reign Nearing Its Ends?", Science, vol. 323, pp. 1000-1002, Feb. 20, 2009]
FIG. 2 is a graph showing the alignment of bands of various group III-V compound semiconductors in consideration of their band gaps and electron affinities.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and "comprising", or idem. "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Figure 3:
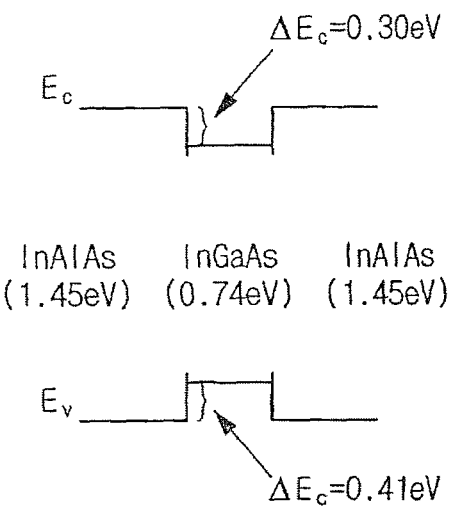
FIG. 3 is a view showing a detailed example of a type-1 heterojunction and a type-1 quantum well.
Figure 4:
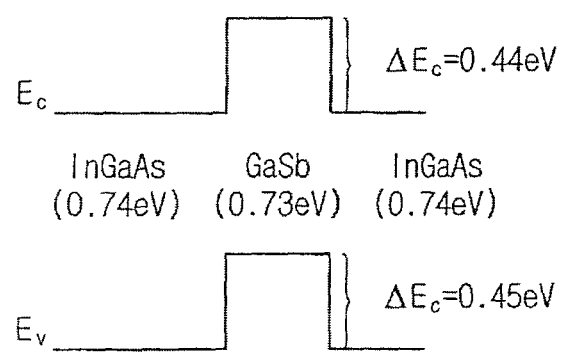
FIG. 4 is a view showing a detailed example of a type-2 heterojunction and a type-2 quantum well.

FIG. 2 is a graph showing the alignment of bands of various group III-V compound semiconductors in consideration of their band gaps and electron affinities. FIG. 3 is a view showing a detailed example of a type-1 heterojunction and a type-1 quantum well. FIG. 4 is a view showing a detailed example of a type-2 heterojunction and a type-2 quantum well.

As can be shown in FIG. 2, since the semiconductors have different electron affinities or band gaps from one another, various group III-V semiconductors are aligned using various methods when two heterogeneous semiconductors are joined together.

These alignment methods are shown in FIGS. 3 and 4, respectively. When a semiconductor with a narrow band gap is aligned next to each semiconductor with a wide band gap in a sandwich form, the semiconductor with the narrow band gap is aligned between the semiconductors with the wide band gap as shown in FIG. 3, so that electrons and holes are all trapped in a quantum well. The quantum well is referred to as a type-1 quantum well. In FIG. 3, InAlAs lattice-matched to InP (hereinafter, referred to just as "InAlAs" without additional expression in the specification) is shown as an example as the semiconductor with the wide band gap, and InGaAs lattice-matched to InP (hereinafter, referred to just as "InGaAs" without additional expression in the specification).

Since the difference of electron affinities or band gap between two kinds of semiconductors exists especially, a middle semiconductor is aligned with respect to semiconductors that surround the middle semiconductor as shown in FIG. 4, so that only one of electron and holes are trapped in a quantum well. The quantum well is referred to as a type-2 quantum well. Unlike the type-1 quantum well in which electrons and holes are all trapped, any structure in which only one of electrons and holes are trapped may be included in the concept of the type-2 quantum well defined in the specification even though the structure is expressed as a different ten from the type-2 quantum well. In FIG. 4, GaSb is shown as an example of the middle semiconductor, and InGaAs lattice-matched to InP is shown as an example of the semiconductor that surrounds the middle semiconductor. Referring to FIG. 4, it can be seen that both valence and the conduction bands are protruded upward from GaSb that is the middle semiconductor. As will be described later, a type-2-quantum well in which the valence and conduction bands are protruded upward is produced, so that the valence band is approximated to the Fermi level, thereby generating a two-dimensional hole gas (2DHG).

Figure 5:
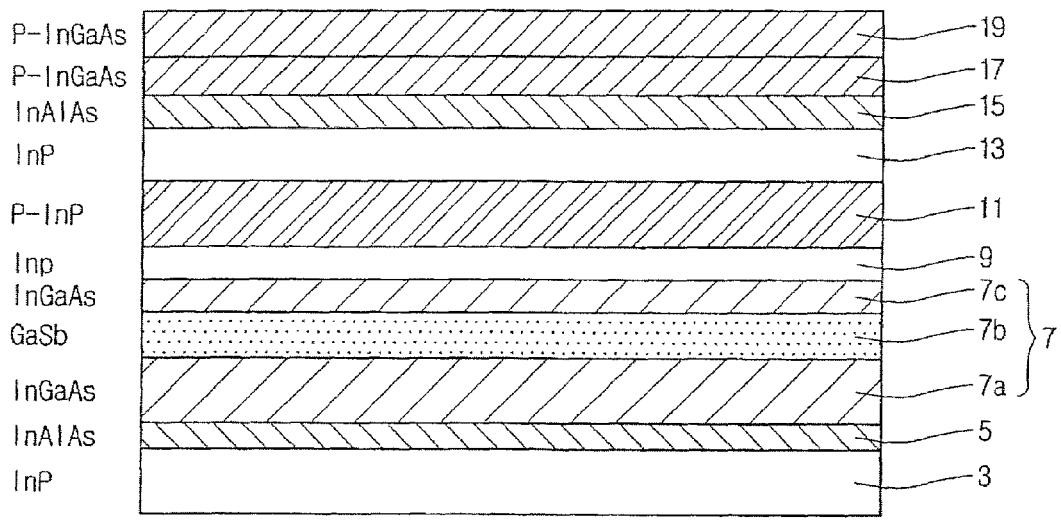
FIG. 5 is a sectional view showing an embodiment of a semiconductor device of a two-dimensional hole gas structure, to which a type-2 quantum well is applied.

FIG. 5 is a sectional view showing an embodiment of a semiconductor device of a 2DHG structure, to which a type-2 quantum well is applied.

The semiconductor device 1 of FIG. 5 is a kind of group III-V compound semiconductor, and correspond to a heterojunction field effect transistor (high hole mobility transistor). The semiconductor device 1 includes a semiconductor substrate 3, a buffer layer 5, type-2 quantum wells 7 (7a, 7b and 7c), a first space layer 9, a p-type doping layer 11, a second space layer 13, a Schottky junction layer 15, ohmic contact layers 17 and 19.

The semiconductor substrate 3 may be made of InP that can be easily obtained, and InP, InAlAs and InGaAs, which are stabilized in etching and metal joining processes, are used as major structural materials. The structure stacked on the semiconductor substrate 3 will be described in detail.

A buffer layer 5 made of InAlAs may be formed on the semiconductor substrate 3 made of InP. However, the buffer layer 5 may not be inserted, if necessary.

A type-2 quantum well 7 is formed on the buffer layer 5. Specifically, the type-2 quantum well 7 is formed using a method in which the entire quantum well structure is formed as the type-2 quantum well structure by introducing GaSb with a thickness of 4 nm to the type-1 quantum well structure of InGaAs/InP. That is, a first semiconductor layer 7a made of InGaAs is grown on the buffer layer 5, and a second semiconductor layer 7b made of GaSb is grown on the first semiconductor layer 7a. Then, a third semiconductor layer 7c made of InGaAs is grown on the second semiconductor layer 7b. The type 2 quantum well 7 is formed by growing the first semiconductor layer 7a, the second semiconductor layer 7b and the third semiconductor layer 7c. As a detailed embodiment, InGaAs of 10 nm, GaSb of 4 nm and InGaAs of 2 nm are used as the first semiconductor layer 7a, the second semiconductor layer 7b and the third semiconductor layer 7c, respectively.

Since GaSb has a lattice length of 0.61 nm and InGaAs has a lattice length of 0.58 nm, there exists a lattice mismatch between GaSb and InGaAs. However, since their lattice lengths are within the critical thickness, their growth is possible without any defect. Also, the strain by the lattice mismatch separates the level of heavy holes and the level of light holes from each other, thereby enabling holes to move faster.

A thin InP first space layer 9 with a thickness of about 4 nm is formed on the structure of InGaAs/GaSb/InGaAs type-2 quantum well 7, and a p-type doping layer 11 is formed on the first space layer 9. The p-type doping layer 11 is made of p-InP (InP doped with a p-type impurity) with a thickness of about 20 nm. By using p-InP, the quantum well can more easily reach the Fermi level as compared with InAlAs. This functions to lower the operational voltage of the semiconductor device 1 according to the embodiment.

A second space layer 13 made of InP with a thickness of about 10 nm is formed on the p-type doping layer 11, and a Schottky junction layer 15 made of InAlAs with a thickness of about 5 nm is formed on the second space layer 13. Then, a first ohmic contact layer 17 made of p-InGaAs (InGaAs doped with a p-type impurity) with a thickness of about 10 nm and a second ohmic contact layer 19 made of p-InGaAs with a thickness of about 20 nm are sequentially formed on the Schottky junction layer 15.

The effect by the type-2 quantum well of the semiconductor device 1 according to the embodiment will be described with respect to FIGS. 6 and 7.

Figure 6:
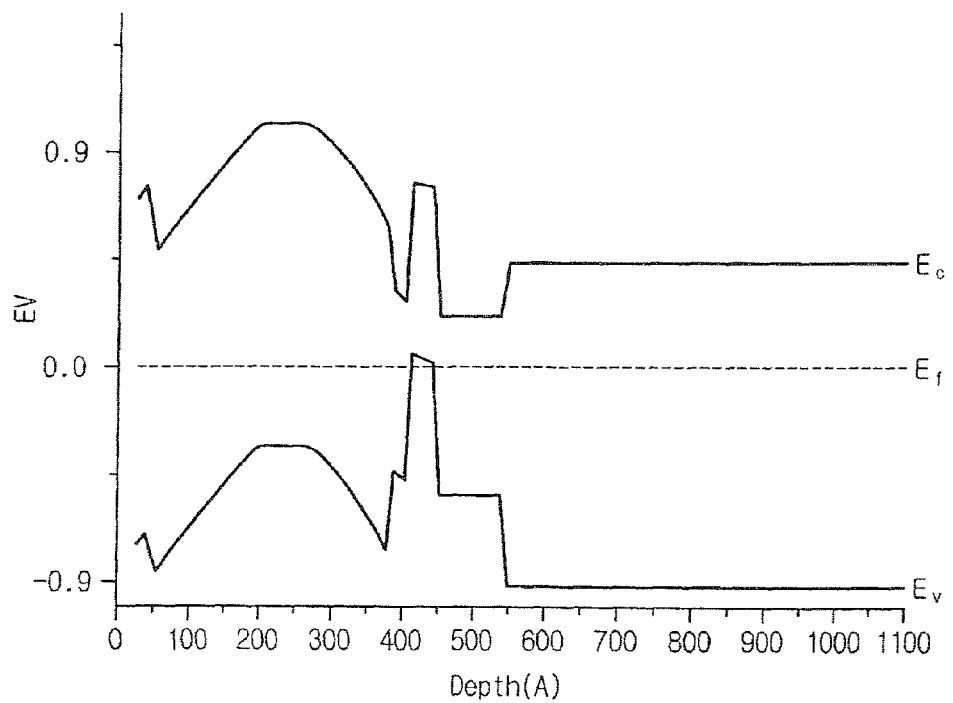
FIG. 6 is a graph showing the alignment of band gaps according to the embodiment of FIG. 5.
Figure 7:
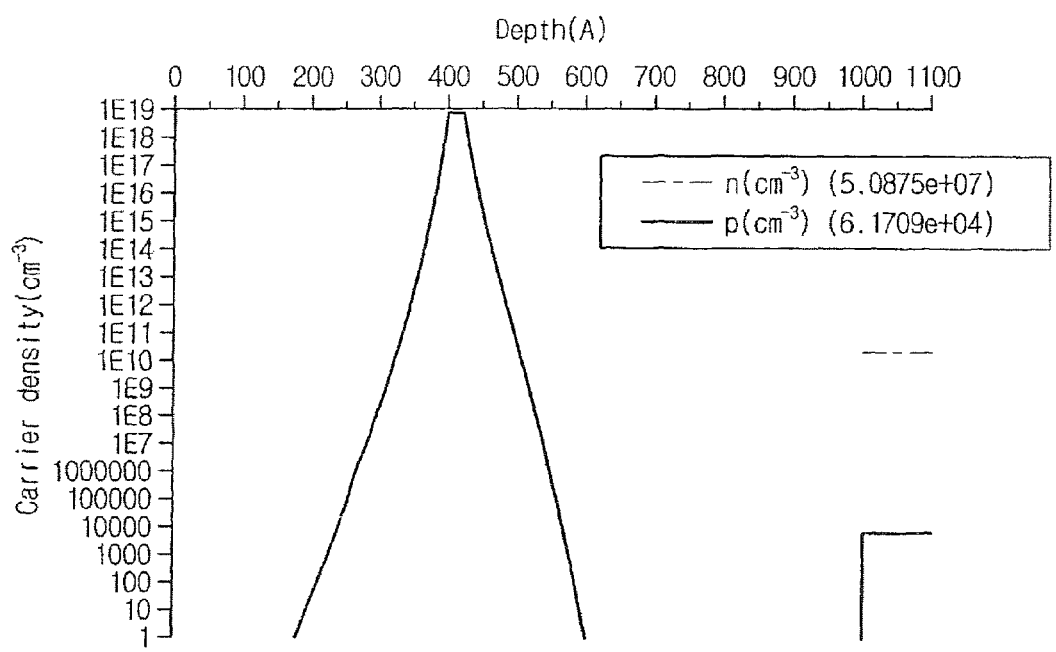
FIG. 7 is a graph showing the distribution of holes according to the embodiment of FIG. 5.

FIG. 6 is a graph showing the alignment of band gaps according to the embodiment of FIG. 5. FIG. 7 is a graph showing the distribution of holes according to the embodiment of FIG. 5.

As can be seen in FIG. 6, the second semiconductor layer 7b made of GaSb is inserted into the type-1 quantum well structure, so that the conduction band can more easily reach the Fermi level. Referring to FIG. 7, it can be seen that holes are gathered as 2DHG in the type-2 quantum well 7.

Through the aforementioned method, the 2DHG is generated using the type-2 quantum well structure, and the 2DHG is applied to the p-type semiconductor device, so that a high-speed p-type semiconductor device can be fabricated, and the 2DHG joined with the existing group III-V n-type semiconductor can be applied to complementary logic devices.

Also, 2DHG can be generated through applications of type-2 heterojunction using various semiconductors, and the 2DHG can be applied to the p-type semiconductor device.

As described above, disclosed herein is a method fundamentally different from the existing fabrication method of a high-speed p-type semiconductor device, i.e., a method of increasing the hole mobility in 2DHG by using Ge with fast hole mobility [G. Hock, et al.] or by changing the strain of the type-1 quantum well. [J. B. boos, et al.]

That is, the valence band easily approaches the Fermi level by introducing the type-2 quantum well, so that me 2DHG can be generated. As a detailed embodiment, the type-2 heterojunction between GaSb and InGaAs lattice-matched to InP enables holes to be two-dimensionally trapped in the quantum well. Additionally, the strain by the lattice mismatch between GaSb and InGaAs separates the level of heavy holes and the level of light holes from each other, thereby enabling holes to move faster. Accordingly, a high-speed p-type semiconductor device can be fabricated. Particularly, the high-speed p-type semiconductor device combined with the existing group III-V n-type semiconductor device can be applied to complementary logic devices.

While the disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A p-type semiconductor device comprising:
a semiconductor substrate;
a type-2 quantum well formed of semiconductor materials with different electron affinities or band gaps on the semiconductor substrate, a p-type doping layer formed in the vicinity of the type-2 quantum well, a semi-insulating second space layer formed on the p-type doping layer, and a Schottky junction layer formed on the semi-insulating second space layer.

2. The p-type semiconductor device according to claim 1, wherein the type-2 quantum well comprises a first semiconductor layer grown on the semiconductor substrate, a semiconductor layer that is grown on the first semiconductor layer and has a different electron affinity or band gap from the first semiconductor layer, and a third semiconductor layer that is grown on a second semiconductor layer and has a different electron affinity or band gap from the second semiconductor.

3. The p-type semiconductor device according to claim 2, wherein the first and third semiconductor layer are made of the same material.

4. The p-type semiconductor device according to claim 2, wherein the first or third semiconductor layer is made of InGaAs.

5. The p-type semiconductor device according to claim 2, wherein the second semiconductor layer is made of GaSb.

6. The p-type semiconductor device according to claim 1, wherein the semiconductor substrate is made of InP.

7. The p-type semiconductor device according to claim 1, wherein the p-type doping layer is made of InP doped with a p-type impurity.

8. The p-type semiconductor device according to claim 1, further comprising a buffer layer interposed between the semiconductor substrate and the type-2 quantum well.

9. The p-type semiconductor device according to claim 8, wherein the buffer layer is made of InAlAs.

10. The p-type semiconductor device according to claim 1, further comprising a semi-insulating first space layer interposed between the type-2 quantum well and the p-type doping layer.

11. The p-type semiconductor device according to claim 10, wherein the semi-insulating first space layer is made of InP.

12. The p-type semiconductor device according to claim 1, wherein the semi-insulating second space layer is made of InP.

13. The p-type semiconductor device according to claim 1, wherein the Schottky junction layer is made of InAlAs.

14. The p-type semiconductor device according to claim 1, further comprising an ohmic contact layer formed on the Schottky junction layer.

15. The p-type semiconductor device according to claim 1, wherein the ohmic contact layer is made of InGaAs doped with a p-type impurity.

16. A fabrication method of a p-type semiconductor device, the method comprising: providing a semiconductor substrate; and growing a first semiconductor layer on the semiconductor substrate, growing a second semiconductor layer with a different electron affinity or band gap from the first semiconductor layer on the first semiconductor layer, and growing a third semiconductor layer with a different electron affinity or band gap from the second semiconductor layer, thereby forming a type-2 quantum well, the method further comprising the steps of forming a p-type doping layer in the vicinity of the type-2 quantum well, forming a semi-insulating second space layer on the p-type doping layer, and forming a Schottky junction layer on the semi-insulating second space layer.

17. The method according to claim 16, wherein the step of forming a p-type doping layer in the vicinity of the type-2 quantum well generates a two-dimensional hole gas.

18. The method according to claim 17, further comprising forming a semi-insulating space layer between the type-2 quantum well and the p-type doping layer.

19. The method according to claim 16, further comprising forming a buffer layer between the semiconductor substrate and the type-2 quantum well.

* * * * *